(12) United States Patent
Heo et al.

(10) Patent No.: US 10,516,418 B2
(45) Date of Patent: Dec. 24, 2019

(54) HYBRID TYPE ITERATIVE DECODING METHOD AND APPARATUS

(71) Applicant: Korea University Research and Business Foundation, Seoul (KR)

(72) Inventors: Jun Heo, Seoul (KR); Byung Kyu Ahn, Seoul (KR); Sung Sik Yoon, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/653,901

(22) Filed: Jul. 19, 2017

(65) Prior Publication Data

US 2018/0309463 A1 Oct. 25, 2018

(30) Foreign Application Priority Data

Apr. 25, 2017 (KR) ........................ 10-2017-0052867

(51) Int. Cl.
*H03M 13/00* (2006.01)
*H03M 13/29* (2006.01)
*H03M 13/11* (2006.01)

(52) U.S. Cl.
CPC ... *H03M 13/2963* (2013.01); *H03M 13/2918* (2013.01); *H03M 13/2927* (2013.01); *H03M 13/1108* (2013.01); *H03M 13/1111* (2013.01)

(58) Field of Classification Search
CPC ......... H03M 13/2963; H03M 13/2918; H03M 13/2917
See application file for complete search history.

(56) References Cited

U.S. PATENT DOCUMENTS

| | | | | |
|---|---|---|---|---|
| 4,845,714 A * | 7/1989 | Zook | ................. | H03M 13/1515 714/755 |
| 5,406,570 A * | 4/1995 | Berrou | ................... | H03M 13/23 375/341 |
| 6,526,538 B1 * | 2/2003 | Hewitt | .............. | H03M 13/2918 375/262 |
| 7,039,846 B2 * | 5/2006 | Hewitt | ................ | H03M 13/258 714/755 |
| 7,356,752 B2 * | 4/2008 | Hewitt | .............. | H03M 13/2903 714/755 |
| 7,415,651 B2 * | 8/2008 | Argon | ................... | H04L 1/0063 714/755 |
| 7,502,982 B2 * | 3/2009 | Silvus | ............... | H03M 13/2966 714/753 |

(Continued)

*Primary Examiner* — Esaw T Abraham
(74) *Attorney, Agent, or Firm* — Fox Rothschild LLP

(57) ABSTRACT

A hybrid type iterative decoding method for a three-dimensional turbo product code (TPC) having a first axis (FA), a second axis (SA), and a third axis (TA) including: a parallel decoding step of applying a predetermined decoding algorithm (PDA) in parallel to current FA and SA input values (IVs) which are determined based on at least two previous decoding values (DVs), respectively, among the previous FA, SA and TA DVs which are generated in advance to generate a current FA DV and a current SA DV, respectively; a serial decoding step of applying PDA to a current TA IV determined based on the current FA and SA DVs to generate a current TA DV; and performing hard decision based on the current FAs DV, the current SA DV, the current TA DV, and the received signal value.

12 Claims, 7 Drawing Sheets

(56) References Cited

U.S. PATENT DOCUMENTS

| | | | |
|---|---|---|---|
| 8,014,332 B2 * | 9/2011 | Oh .................... | H04N 21/4382 370/312 |
| 8,074,152 B2 * | 12/2011 | Oh ....................... | H04L 12/189 714/770 |
| 8,982,869 B2 * | 3/2015 | Oh .................... | H04N 21/4382 370/312 |

* cited by examiner

[FIG. 1]
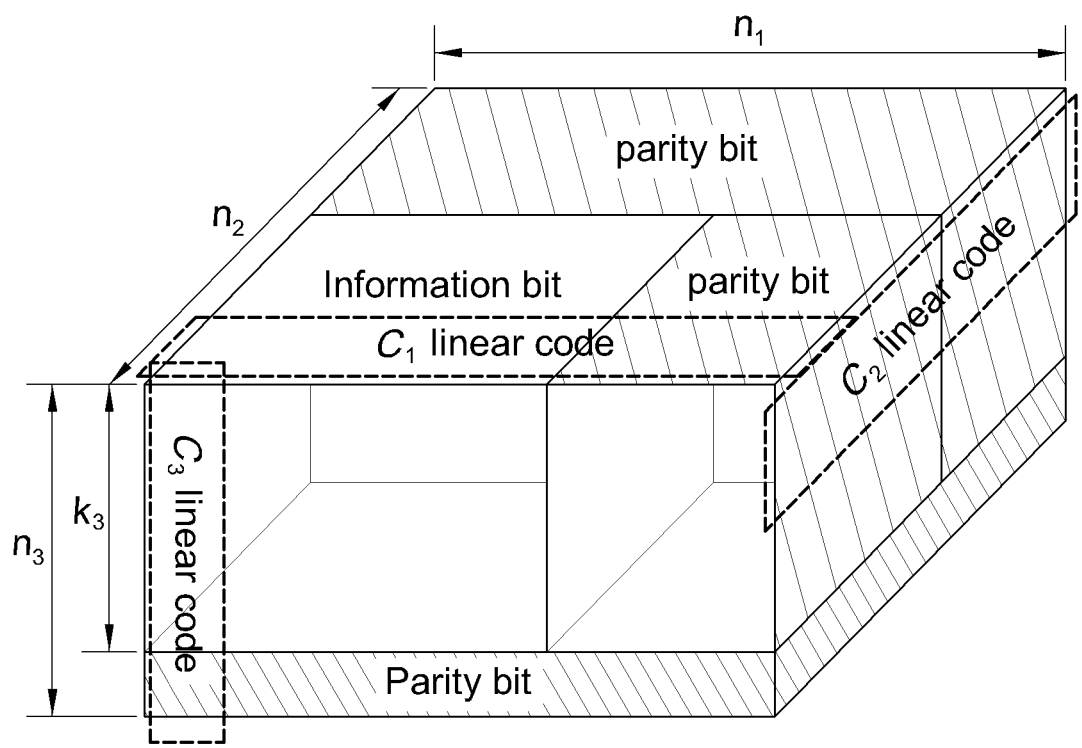

[FIG. 2]
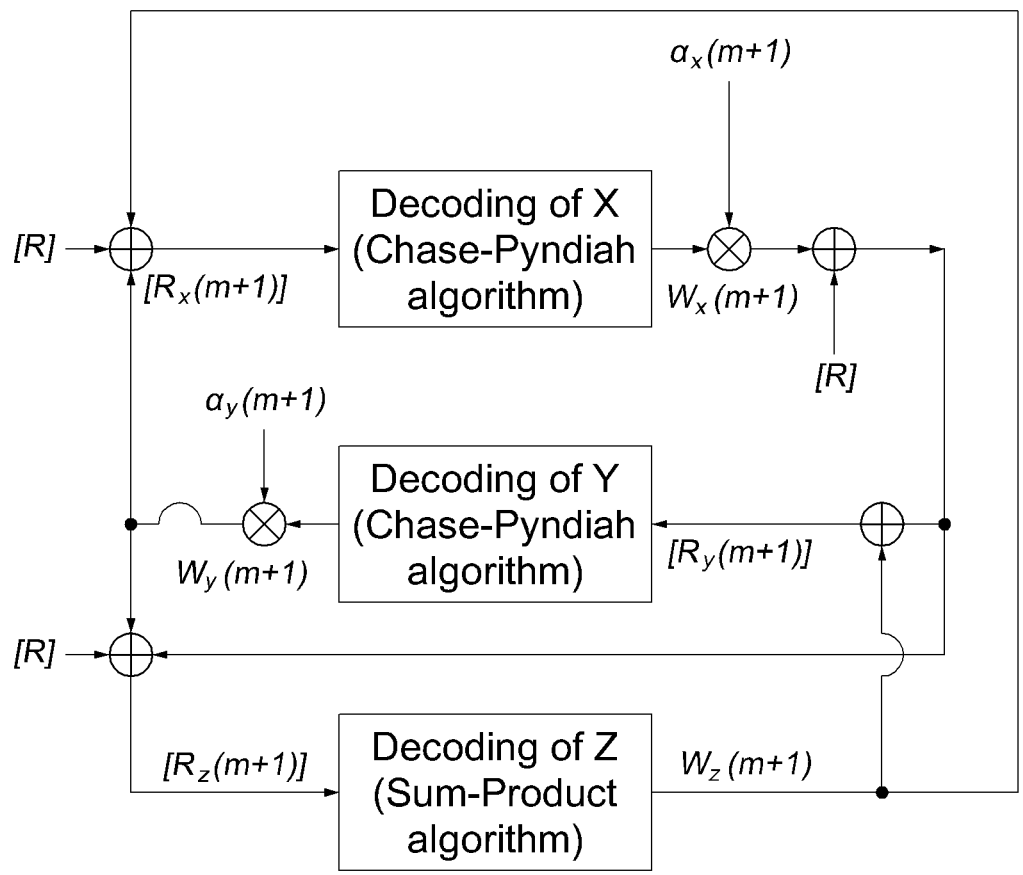
"PRIOR ART"

[FIG. 3]
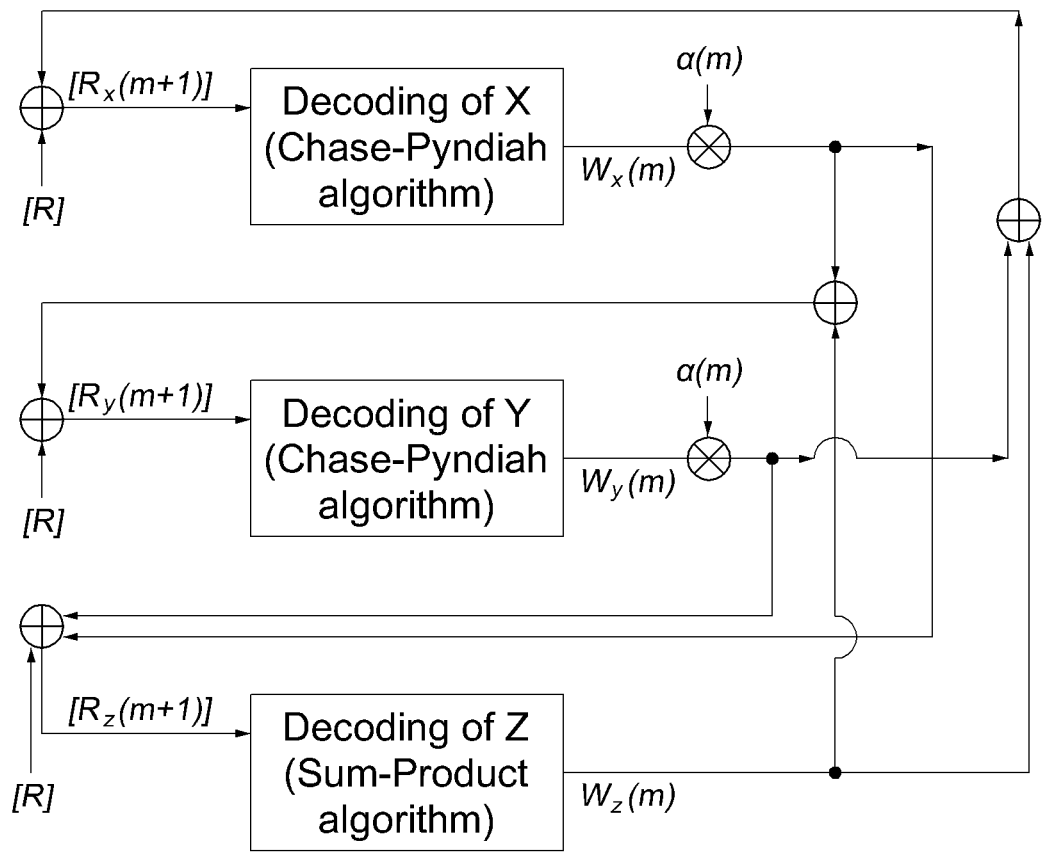
"PRIOR ART"

[FIG. 4]
400
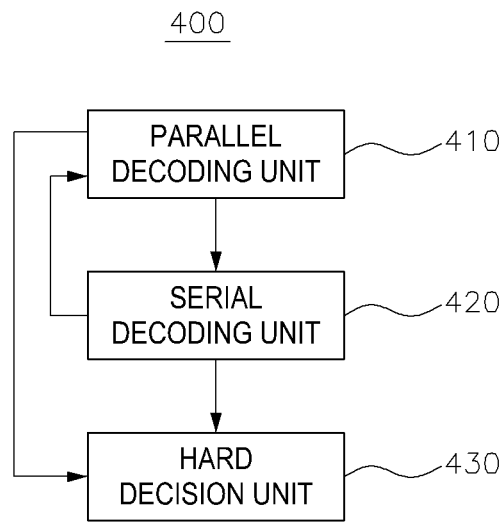
[FIG. 5]
410
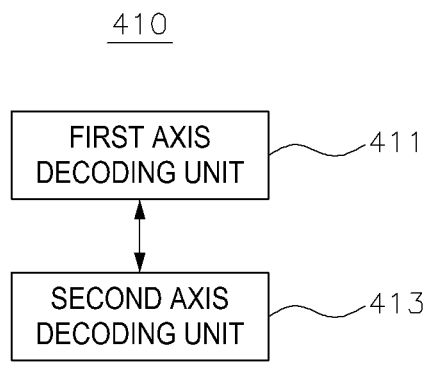

[FIG. 6]
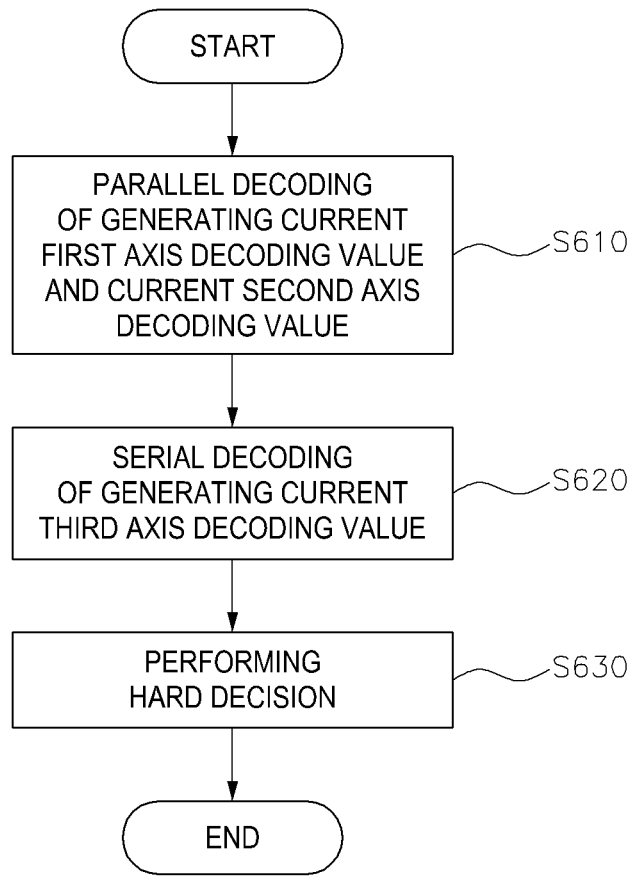

[FIG. 7]
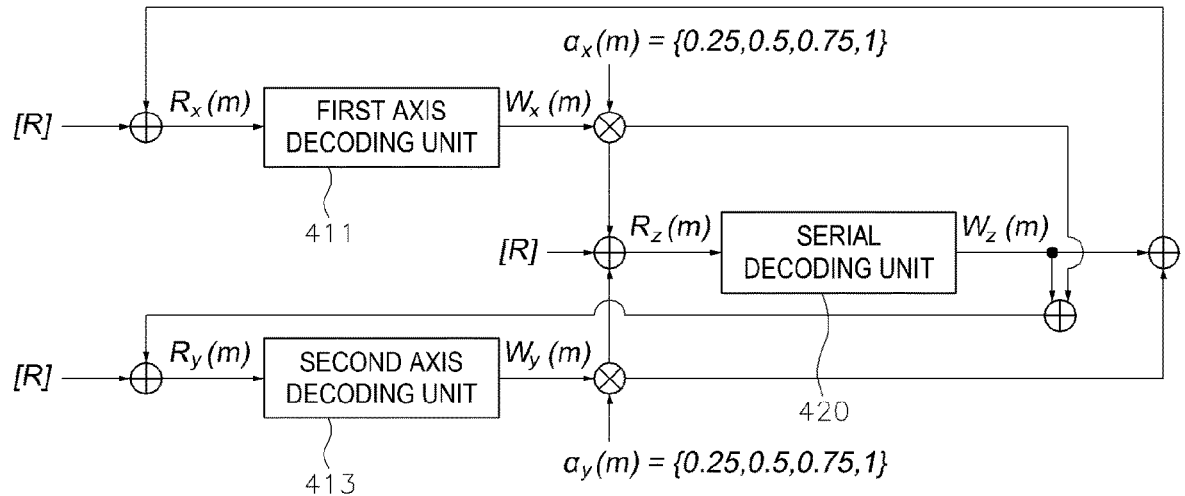
[FIG. 8]
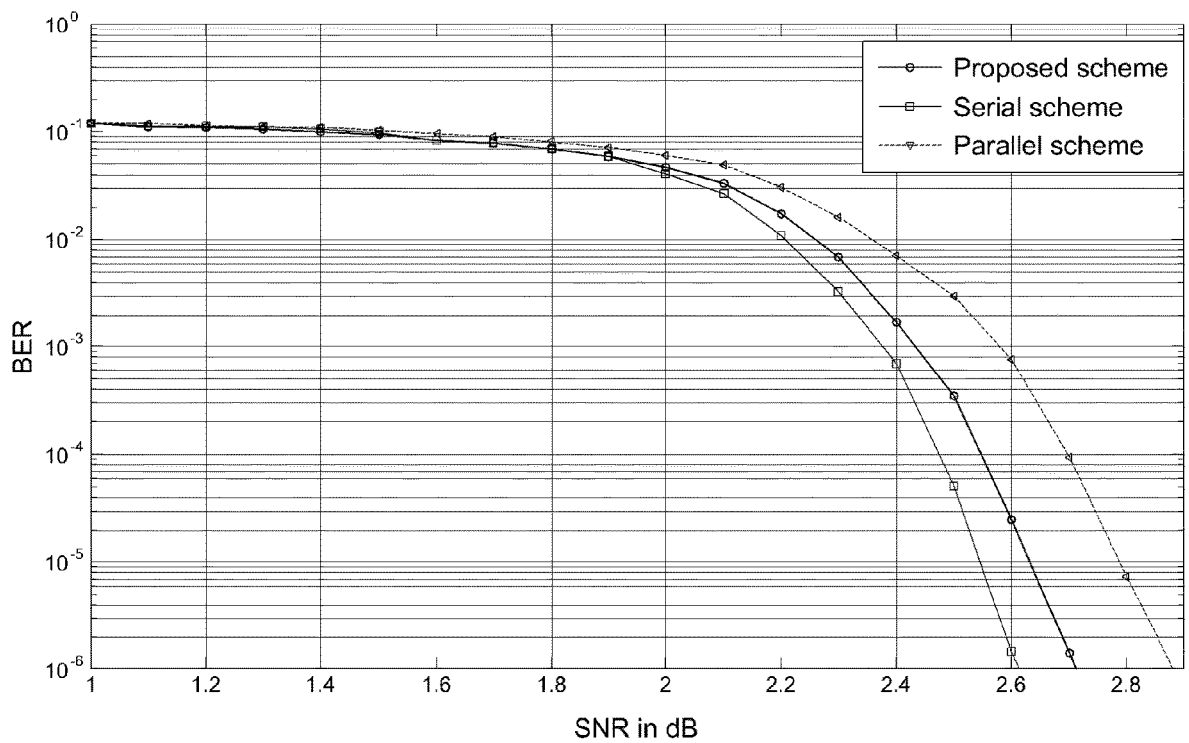

[FIG. 9]
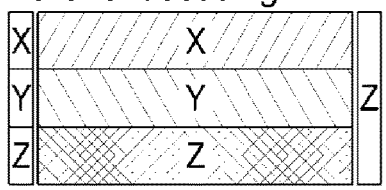

HYBRID TYPE ITERATIVE DECODING METHOD AND APPARATUS

CROSS-REFERENCE TO RELATED APPLICATIONS

This application claims the priority of Korean Patent Application No. 10-2017-0052867 filed on Apr. 25, 2017, in the Korean Intellectual Property Office, the disclosure of which is incorporated herein by reference.

BACKGROUND

Field

The present disclosure relates to a hybrid type iterative decoding method for a three-dimensional turbo product code (TPC) having an X-axis, a Y-axis, and a Z-axis and an apparatus thereof.

Description of the Related Art

A turbo product code (TPC) is a code scheme in which linear block codes having a short length are multi-dimensionally combined. The turbo produce code is utilized for simply decoding and coding a code with a long code length. In this case, the turbo product code (TPC) may be configured as a product of various types of block codes. Various decoding algorithms including a MAP decoding algorithm and a chase-pyndiah decoding algorithm may be utilized as a soft-in soft-out decoding algorithm of the turbo product code (TPC). Among the decoding algorithms, the chase-pyndiah decoding algorithm is characterized to have low complexity.

As an iterative decoding scheme for decoding the turbo product code (TPC), a serial decoding scheme and a parallel decoding scheme have been suggested in the related art. However, an error correcting performance of the serial decoding scheme is relatively excellent, but the serial decoding scheme has a disadvantage in that an operation time is long. In contrast, an operating time of the parallel decoding scheme is short, but the error correcting performance is relatively low.

SUMMARY

An object of the present disclosure is to perform parallel decoding on a first axis and a second axis of a three-dimensional turbo product code and perform serial decoding on the third axis to generate a first axis decoding value, a second axis decoding value, and a third axis decoding value and perform hard decision using the generated first axis decoding value, second axis decoding value, and third axis decoding value.

Technical problems of the present disclosure are not limited to the above-mentioned technical problems, and other technical problems, which are not mentioned above, can be clearly understood by those skilled in the art from the following descriptions.

A hybrid type iterative decoding method may refer to a hybrid type iterative decoding method for a three-dimensional turbo product code (TPC) having a first axis, a second axis, and a third axis.

For example, the hybrid type iterative decoding method includes a parallel decoding step of applying a predetermined decoding algorithm in parallel to a current first axis input value and a current second axis input value which are determined based on at least two previous decoding values, respectively, among a previous first axis decoding value, a previous second axis decoding value, and a previous third axis decoding value which are generated in advance to generate a current first axis decoding value and a current second axis decoding value, respectively, by means of a parallel decoding unit; a serial decoding step of applying the predetermined decoding algorithm to a current third axis input value determined based on the current first axis decoding value and the current second axis decoding value to generate a current third axis decoding value, by means of a serial decoding unit; and performing hard decision based on the current first axis decoding value, the current second axis decoding value, the current third axis decoding value, and a received signal value, by means of a hard decision unit.

The performing of hard decision may be performed after sequentially repeating the parallel decoding step and the serial decoding step by a predetermined number of iterative decoding times.

For example, the parallel decoding step may include: a first axis decoding step of applying the predetermined decoding algorithm to the current first axis input value determined based on the previous second axis decoding value and the previous third axis decoding value to generate the current first axis decoding value, by means of a first axis decoding unit; and a second axis decoding step of applying the predetermined decoding algorithm to the current second axis input value determined based on the previous first axis decoding value and the previous third axis decoding value to generate the current second axis decoding value, by means of a second axis decoding unit.

The first axis decoding step and the second axis decoding step may be simultaneously performed in parallel with each other.

For example, the current first axis input value may be determined further based on at least one of the received signal value and a previous second axis reliability weight indicating reliability of the previous second axis decoding value and the current second axis input value may be determined further based on at least one of the received signal value and a previous first axis reliability weight indicating reliability of the previous first axis decoding value.

For example, the current third axis input value may be determined further based on at least one of the received signal value, a current first axis reliability weight indicating reliability of the current first axis decoding value, and a current second axis reliability weight indicating reliability of the current second axis decoding value.

According to another aspect of the present disclosure, a hybrid type iterative decoding apparatus may refer to a hybrid type iterative decoding apparatus for a three-dimensional turbo product code (TPC) having a first axis, a second axis, and a third axis.

In some scenarios, the hybrid type iterative decoding apparatus includes a parallel decoding unit which applies a predetermined decoding algorithm in parallel to a current first axis input value and a current second axis input value which are determined based on at least two previous decoding values, respectively, among a previous first axis decoding value, a previous second axis decoding value, and a previous third axis decoding value which are generated in advance to generate a current first axis decoding value and a current second axis decoding value, respectively; a serial decoding unit applies the predetermined decoding algorithm to a current third axis input value determined based on the current first axis decoding value and the current second axis decoding value to generate a current third axis decoding value; and a hard decision unit which performs hard decision based on the current first axis decoding value, the current second axis decoding value, the current third axis decoding value, and the received signal value.

For example, the hard decision unit may perform hard decision after sequentially repeating the parallel decoding by the parallel decoding unit and the serial decoding by the serial decoding unit by a predetermined number of iterative decoding times.

For example, the parallel decoding unit may include: a first axis decoding unit which applies the predetermined decoding algorithm to the current first axis input value determined based on the previous second axis decoding value and the previous third axis decoding value to generate the current first axis decoding value; and a second axis decoding unit which applies the predetermined decoding algorithm to the current second axis input value determined based on the previous first axis decoding value and the previous third axis decoding value to generate the current second axis decoding value.

For example, the first axis decoding unit and the second axis decoding unit may simultaneously operate in parallel with each other.

For example, the current first axis input value may be determined further based on at least one of the received signal value and a previous second axis reliability weight indicating reliability of the previous second axis decoding value and the current second axis input value may be determined further based on at least one of the received signal value and a previous first axis reliability weight indicating reliability of the previous first axis decoding value.

In those or other scenarios, the current third axis input value is determined further based on at least one of the received signal value, a current first axis reliability weight indicating reliability of the current first axis decoding value, and a current second axis reliability weight indicating reliability of the current second axis decoding value.

In those or yet other scenarios, parallel decoding is performed on a first axis and a second axis of a three-dimensional turbo product code and serial decoding is performed on the third axis to generate a first axis decoding value, a second axis decoding value, and a third axis decoding value and perform hard decision using the generated first axis decoding value, second axis decoding value, and third axis decoding value, thereby achieving excellent error correcting performance while shortening an operation time.

BRIEF DESCRIPTION OF DRAWINGS

The above and other aspects, features and other advantages of the present disclosure will be more clearly understood from the following detailed description taken in conjunction with the accompanying drawings.

FIG. 1 is a view for explaining a three-dimensional turbo product code (TPC).

FIG. 2 is a view for explaining a serial decoding scheme of the related art for decoding a three-dimensional turbo product code (TPC).

FIG. 3 is a view for explaining a parallel decoding scheme of the related art for decoding a three-dimensional turbo product code (TPC).

FIG. 4 is a diagram for explaining a hybrid type iterative decoding apparatus.

FIG. 5 is a diagram for explaining a parallel decoding unit of a hybrid type iterative decoding apparatus.

FIG. 6 is a flowchart for explaining a hybrid type iterative decoding method.

FIG. 7 is a view for explaining a hybrid type iterative decoding method and apparatus.

FIG. 8 is a view for comparing an error correcting performance of a hybrid type iterative decoding method and apparatus according to the present solution and a decoding scheme of the related art.

FIG. 9 is a view for comparing an operation time of a hybrid type iterative decoding method and apparatus according to the present solution and a decoding scheme of the related art.

DETAILED DESCRIPTION

Hereinafter, the present solution will be described in detail with reference to the accompanying drawings so that those skilled in the art may easily carry out the technical spirit of the present disclosure. In the figures, even though the parts are illustrated in different drawings, it should be understood that like reference numbers refer to the same or equivalent parts of the present disclosure throughout the several figures of the drawing. In addition, in the description of the present disclosure, the detailed descriptions of publicly known related constitutions or functions thereof may be omitted if they make the gist of the present disclosure unclear.

Hereinafter, a hybrid type iterative decoding method and apparatus according to the present solution will be described in detail with reference to the accompanying drawings. The term "unit", as used herein, refers to an electronic device that processes data according to a set of instructions. The electronic device can include, but is not limited to, a processor. Processors are well known in the art, and therefore will not be described herein.

First, a three-turbo product code (TPC) will be described with reference to FIG. 1.

FIG. 1 is a view for explaining a three-dimensional turbo product code (TPC).

As illustrated in FIG. 1, a three-dimensional turbo product code (TPC) is configured such that a block code for a first axis including an information bit and a parity bit, a block code for a second axis including an information bit and a parity bit, and a block code for a third axis including an information bit and a parity bit are multiplied to each other. By doing this, linear block codes with a short length are multi-dimensionally combined so that the minimum distance of TPC is given by the product of the minimum distance of component codes.

Now, a serial decoding scheme of the related art for decoding a three-dimensional turbo product code (TPC) will be described with reference to FIG. 2.

FIG. 2 is a view for explaining a serial decoding scheme of the related art for decoding a three-dimensional turbo product code (TPC).

As illustrated in FIG. 2, according to the serial decoding scheme, decoding of an X-axis, a Y-axis, and a Z-axis is sequentially performed to reflect a result of decoding of previous axes in the corresponding iterative decoding and generate an input of a subsequent axis.

That is, according to the serial decoding scheme, a current Y-axis input value is generated based on the current X-axis decoding value and a current Z-axis input value is generated based on the current X-axis decoding value and the current Y-axis decoding value. By doing this, the X-axis decoding, the Y-axis decoding, and the Z-axis decoding are sequentially performed. Therefore, since the serial decoding scheme may reflect the decoding result of the other axis during one iterative decoding process, the serial decoding scheme has a relatively excellent error correcting performance. However, since the decoding of individual axes is sequentially performed, a throughput is low.

Now, referring to FIG. 3, a parallel decoding scheme of the related art for decoding a three-dimensional turbo product code (TPC) will be described.

FIG. 3 is a view for explaining a parallel decoding scheme of the related art for decoding a three-dimensional turbo product code (TPC).

As illustrated in FIG. 3, a parallel decoding structure is configured such that a result obtained by simultaneously performing decoding on individual axes is used to update an input value to be used for decoding in a subsequent iterative decoding process. Therefore, result values of each axis do not affect a result of other axis.

That is, according to the parallel decoding scheme, a current X-axis input value is generated based on a previous Y-axis decoding value and a previous Z-axis decoding value, a current Y-axis input value is generated based on a previous X-axis decoding value and a previous Z-axis decoding value, and a current Z-axis input value is generated based on a previous X-axis decoding value and a previous Y-axis decoding value. Therefore, by doing this, X-axis decoding, Y-axis decoding, and Z-axis decoding are simultaneously performed so that the parallel decoding scheme is advantageous for a throughput. However, in one iterative decoding, a decoding result of the other axis is not reflected the parallel decoding scheme is disadvantageous in that a performance is lowered.

Now, a hybrid type iterative decoding apparatus according to the present solution will be described with reference to FIG. 4.

FIG. 4 is a diagram for explaining a hybrid type iterative decoding apparatus according to the present solution.

As illustrated in FIG. 4, a hybrid type iterative decoding apparatus 400 includes a parallel decoding unit 410, a serial decoding unit 420, and a hard decision unit 430.

The hybrid type iterative decoding apparatus 400 may refer to a hybrid type iterative decoding apparatus 400 for a three-dimensional turbo product code (TPC) having a first axis, a second axis, and a third axis.

The parallel decoding unit 410 applies a predetermined decoding algorithm in parallel to a current first axis input value and a current second axis input value which are determined based on at least two previous decoding values, respectively, among the previous first axis decoding value, the previous second axis decoding value, and the previous third axis decoding value which are generated in advance to generate a current first axis decoding value and a current second axis decoding value, respectively.

The serial decoding unit 420 applies a predetermined decoding algorithm to the current third axis input value determined based on the current first axis decoding value and the current second axis decoding value to generate the current third axis decoding value.

The hard decision unit 430 performs hard decision based on the current first axis decoding value, the current second axis decoding value, the third axis decoding value, and a received signal value.

In this case, the hard decision unit 430 adds all the current first axis decoding value, the current second axis decoding value, the third axis decoding value, and the received signal value and determines the added value to be 1 when the added value is larger than zero and to be zero when the added value is smaller than zero.

In some scenarios, the received signal value may refer to received signal information which is input to the hybrid type iterative decoding apparatus 400 through a channel.

In some scenarios, the first axis input value and the second axis input value which are input to the parallel decoding unit 410 and the third axis input value and the received signal value which are input to the serial decoding unit 420 may refer to soft input values, but the present disclosure is not limited thereto.

For example, all the first axis decoding value and the second axis decoding value generated by the parallel decoding unit 410 and the third axis decoding value generated by the serial decoding unit 420 may refer to soft output values, but the present disclosure is not limited thereto.

In some scenarios, the hard decision unit 430 may perform the hard decision after sequentially repeating the parallel decoding by the parallel decoding unit 410 and the serial decoding by the serial decoding unit 420 by a predetermined number of iterative decoding times.

For example, when the predetermined number of iterative decoding times is four, the hard decision unit 430 may perform the hard decision after repeating an operation of sequentially performing the parallel decoding and the serial decoding four times.

In some scenarios, the current third axis input value may be determined further based on at least one of the received signal value, a current first axis reliability weight indicating reliability of the current first axis decoding value and a current second axis reliability weight indicating reliability of the current second axis decoding value.

Now, the parallel decoding unit 410 will be described with reference to FIG. 5.

FIG. 5 is a diagram for explaining a parallel decoding unit of a hybrid type iterative decoding apparatus.

As illustrated in FIG. 5, the parallel decoding unit 410 includes a first axis decoding unit 411 and a second axis decoding unit 413.

The first axis decoding unit 411 applies a predetermined decoding algorithm to the current first axis input value which is determined based on the previous second axis decoding value and the previous third axis decoding value to generate a current first axis decoding value.

The second axis decoding unit 413 applies a predetermined decoding algorithm to the current second axis input value which is determined based on the previous first axis decoding value and the previous third axis decoding value to generate a current second axis decoding value.

In some scenarios, the first axis decoding unit 411 and the second axis decoding unit 413 may simultaneously operate in parallel with each other.

In some scenarios, the current first axis input value may be determined further based on at least one of the received signal value and the previous second axis reliability weight indicating reliability of the previous second axis decoding value.

For example, the current second axis input value may be determined further based on at least one of the received signal value and the previous first axis reliability weight indicating reliability of the previous first axis decoding value.

More detailed description of the hybrid type iterative decoding apparatus 400 will be provided below with reference to FIGS. 6 to 9 and redundant description will be omitted.

Now, a hybrid type iterative decoding method will be described with reference to FIG. 6.

FIG. 6 is a flowchart for explaining a hybrid type iterative decoding method.

As illustrated in FIG. 6, the hybrid type iterative decoding method includes a parallel decoding step S610 of generating a current first axis decoding value and a current second axis decoding value, a serial decoding step S620 of generating a current third axis decoding value, and a step S630 of performing hard decision.

For example, step S610 may refer to a parallel decoding step in which the parallel decoding unit 410 applies a predetermined decoding algorithm in parallel to a current first axis input value and a current second axis input value which are determined based on at least two previous decoding values, respectively, among the previous first axis decoding value, the previous second axis decoding value, and the previous third axis decoding value which are generated in advance to generate a current first axis decoding value and a current second axis decoding value, respectively.

For example, step S610 may include a first axis decoding step (not illustrated) in which the first axis decoding unit 411 applies the predetermined decoding algorithm to the current first axis input value determined based on the previous second axis decoding value and the previous third axis decoding value to generate a current first axis decoding value.

In this case, the current first axis input value may be determined further based on at least one of the received signal value and the previous second axis reliability weight indicating reliability of the previous second axis decoding value.

In some scenarios, a predetermined decoding algorithm which is utilized to generate the current first axis decoding value in the first axis decoding step (not illustrated) may be a chase-pyndiah decoding algorithm for decoding a first axis block code which is coded based on an extended hamming code to include a plurality of parity bits. However, the predetermined decoding algorithm utilized to generate the current first axis decoding value is not limited to the above-described chase-pyndiah decoding algorithm.

In some scenarios, the second axis reliability weight may refer to a weight for a second axis decoding value which is determined in advance for every decoding time of the iterative decoding.

For example, reliability of the second axis decoding value is increased whenever the iterative decoding is performed and the second axis reliability weight may refer to a weight for indicating reliability of the second axis decoding value which is increased whenever the iterative decoding is performed.

For example, when the iterative decoding is performed four times in total, the second axis reliability weights are 0.25 for first iterative decoding, 0.5 for second iterative decoding, 0.75 for third iterative decoding, and 1 for fourth iterative decoding, but the second axis reliability weight of the present disclosure is not limited to a specific numerical value.

In the above-described example, when the number of current decoding times is three, the previous second axis reliability weight refers to 0.5, the previous second axis decoding value refers to a second axis decoding value generated as the second iterative decoding result, the previous third axis decoding value refers to a third axis decoding value generated as a second iterative decoding result, and the received signal value refers to a signal value received through the channel.

For example, step S610 may include a second axis decoding step (not illustrated) in which the second axis decoding unit 413 applies the predetermined decoding algorithm to the current second axis input value determined based on the previous first axis decoding value and the previous third axis decoding value to generate a current second axis decoding value.

In this case, the current second axis input value may be determined further based on at least one of the received signal value and the previous first axis reliability weight indicating reliability of the previous first axis decoding value.

In some scenarios, a predetermined decoding algorithm which is utilized to generate the current second axis decoding value in the second axis decoding step (not illustrated) may be a chase-pyndiah decoding algorithm for decoding a second axis block code which is coded based on an extended hamming code to include a plurality of parity bits. However, the predetermined decoding algorithm utilized to generate the current second axis decoding value is not limited to the above-described chase-pyndiah decoding algorithm.

In some scenarios, the first axis reliability weight may refer to a weight for a first axis decoding value which is determined in advance for every decoding time of the iterative decoding.

For example, similarly to the above-described second axis decoding value, reliability of the first axis decoding value is increased whenever the iterative decoding is performed and the first axis reliability weight may refer to a weight for indicating reliability of the first axis decoding value which is increased whenever the iterative decoding is performed.

For example, when the iterative decoding is performed four times in total, the first axis reliability weights are 0.25 for first iterative decoding, 0.5 for second iterative decoding, 0.75 for third iterative decoding, and 1 for fourth iterative decoding, but the first axis reliability weight of the present disclosure is not limited to a specific numerical value.

In the above-described example, when the number of current decoding times is four, the previous first axis reliability weight refers to 0.75, the previous first axis decoding value refers to a first axis decoding value generated as the third iterative decoding result, the previous third axis decoding value refers to a third axis decoding value generated as a third iterative decoding result, and the received signal value refers to a signal value received through the channel.

In this case, the above-described first axis decoding step (not illustrated) and second axis decoding step (not illustrated) may be simultaneously performed in parallel with each other.

In other words, the first axis decoding step (not illustrated) may refer to a step of generating a current first axis decoding value based on the previous second axis decoding value and the previous third axis decoding value and the second axis decoding step (not illustrated) may refer to a step of generating a current second axis decoding value based on the previous first axis decoding value and the previous third axis decoding value.

In this case, since the first axis decoding step (not illustrated) and the second axis decoding step (not illustrated) are simultaneously performed, the first axis decoding step and the second axis decoding step desirably have the same operation time. To this end, predetermined decoding algorithms utilized in the first axis decoding step (not illustrated) and the second axis decoding step (not illustrated) are desirably the same, but the present disclosure is not limited thereto.

Step S620 refers to a serial decoding step in which the serial decoding unit 420 applies a predetermined decoding algorithm to the current third axis input value determined based on the current first axis decoding value and the current second axis decoding value to generate the current third axis decoding value.

In this case, the current third axis input value may be determined further based on at least one of the received signal value, a current first axis reliability weight indicating reliability of the current first axis decoding value, and a current second axis reliability weight indicating reliability of the current second axis decoding value.

In some scenarios, in step S620, the predetermined decoding algorithm utilized to generate the current third axis decoding value may be a normalized min-sum decoding algorithm for decoding a coded third axis block code based on a single parity code so as to include one parity bit. However, the predetermined decoding algorithm utilized to generate the current third axis decoding value is not limited to the above-mentioned normalized min-sum decoding algorithm.

When the iterative decoding is performed four times in total as described in the above example, step S620 will be described as an example that the first axis reliability weight and the second axis reliability weight are 0.25 for first iterative decoding, 0.5 for second iterative decoding, 0.75 for third iterative decoding, and 1 for fourth iterative decoding.

In the above-described example, when the number of current decoding times is two, the current first axis reliability weight refers to 0.5, the current first axis decoding value refers to a first axis decoding value generated as the second iterative decoding result, the current second axis reliability weight refers to 0.5, the current second axis decoding value refers to a second axis decoding value generated as the second iterative decoding result, and the received signal value refers to a signal value received through the channel.

In other words, step S620 refers to a step of generating a current third axis decoding value based on the current first axis decoding value and the current second axis decoding value generated by the first axis decoding step (not illustrated) and the second axis decoding step (not illustrated) and as a result, step S620 may be performed in series with step S610.

In other words, the first axis decoding step (not illustrated) and the second axis decoding step (not illustrated) are performed in parallel with each other and step S620 which is the third axis decoding step is performed in series, so that the operation time of the hybrid type iterative decoding method and apparatus is determined based on a time consumed for a decoding algorithm having a longer operation time between a predetermined decoding algorithm utilized in the first axis decoding step (not illustrated) and a predetermined decoding algorithm utilized in the second axis decoding step (not illustrated) and a time consumed for the predetermined decoding algorithm utilized in step S620.

Desirably, the predetermined decoding algorithm utilized in step S620 may have a shorter operation time than the predetermined decoding algorithm utilized for the first axis and the second axis in step S610.

In other words, when the predetermined decoding algorithm utilized for decoding the first axis and the second axis in step S610 is a first decoding algorithm and the predetermined decoding algorithm utilized for decoding the third axis and the second axis in step S620 is a second decoding algorithm, the second decoding algorithm is desirably a decoding algorithm having a shorter operation time than that of the first decoding algorithm, but the present disclosure is not limited thereto.

Step S630 may refer to a step in which the hard decision unit 430 performs hard decision based on the current first axis decoding value, the current second axis decoding value, the third axis decoding value, and a received signal value.

In this case, step S630 may be performed after sequentially repeating step S610 and step S620 by a predetermined number of iterative decoding times.

Now, a hybrid type iterative decoding method and apparatus will be described with reference to FIG. 7.

FIG. 7 is a view for explaining a hybrid type iterative decoding method and apparatus.

In order to describe FIG. 7, in the hybrid type iterative decoding method and apparatus, the first axis, the second axis, and the third axis are defined as an X-axis, a Y-axis, and a Z-axis, respectively, but the present disclosure is not limited thereto.

In other words, FIG. 7 will be described on the assumption that the first axis decoding unit 411 decodes an X-axis block code among the three-dimensional turbo product code TPC, the second axis decoding unit 413 decodes a Y-axis block code among the three-dimensional turbo product code TPC, the serial decoding unit 420 decodes a Z-axis block code among the three-dimensional turbo product code TPC, but the present disclosure is not limited thereto.

As illustrated in FIG. 7, a current X-axis input value $R_X(m)$ which is input to the first axis decoding unit 411 in m-th decoding may be generated by adding all the received signal value [R], a product of the previous Y-axis decoding value $W_Y(m-1)$ and the previous Y-axis reliability weight $\alpha_Y(m-1)$, and the previous Z-axis decoding value $W_Z(m-1)$. In this case, the first axis decoding unit 411 may decode the current X-axis input value $R_X(m)$ to generate the current X-axis decoding value $W_X(m)$.

In this case, as illustrated in FIG. 7, the Y-axis reliability weight $\alpha_Y$ may be set in advance for every decoding time and may refer to 0.25 in the first decoding, 0.5 in the second decoding, 0.75 in the third decoding, and 1 in the fourth decoding.

In this case, when the current X-axis input value $R_X(m)$ which is input to the first axis decoding unit 411 in the m-th decoding is represented by Equation, the following Equation 1 may be obtained.

$$R_X(m)=[R]+\alpha_Y(m-1)\times W_Y(m-1)+W_Z(m-1) \qquad \text{[Equation 1]}$$

In this case, m refers to an iterative decoding time, $R_X(m)$ refers to an m-th X-axis input value, [R] refers to a received signal value, $\alpha_Y(m-1)$ refers to an m−1-th Y-axis reliability weight, $W_Y(m-1)$ refers to an m−1-th Y-axis decoding value, and $W_Z(m-1)$ refers to an m−1-th Z-axis decoding value.

As illustrated in FIG. 7, a current Y-axis input value $R_Y(m)$ which is input to the second axis decoding unit 413 in m-th decoding may be generated by adding all the received signal value [R], a product of the previous X-axis decoding value $W_X(m-1)$ and the previous X-axis reliability weight $\alpha_X(m-1)$, and the previous Z-axis decoding value $W_Z(m-1)$. In this case, the second axis decoding unit 413 may decode the current Y-axis input value $R_Y(m)$ to generate the current Y-axis decoding value $W_Y(m)$.

In this case, as illustrated in FIG. 7, the X-axis reliability weight $\alpha_X$ may be set in advance for every decoding time and may refer to 0.25 in the first decoding, 0.5 in the second decoding, 0.75 in the third decoding, and 1 in the fourth decoding.

In this case, when the current Y-axis input value $R_Y(m)$ which is input to the second axis decoding unit 413 in the m-th decoding is represented by Equation, the following Equation 2 may be obtained.

$$R_Y(m)=[R]+\alpha_X(m-1)\times W_X(m-1)+W_Z(m-1) \quad \text{[Equation 2]}$$

In this case, m refers to an iterative decoding time, $R_Y(m)$ refers to an m-th Y-axis input value, [R] refers to a received signal value, $\alpha_X(m-1)$ refers to an m-1-th X-axis reliability weight, $W_X(m-1)$ refers to an m-1-th X-axis decoding value, and $W_Z(m-1)$ refers to an m-1-th Z-axis decoding value.

As illustrated in FIG. 7, the current Z-axis input value $R_Z(m)$ which is input to the serial decoding unit 420 in the m-th decoding may be generated by adding all the received signal value [R], a product of the current X-axis decoding value $W_X(m)$ and the current X-axis reliability weight $\alpha_X(m)$, and a product of the current Y-axis decoding value $W_Y(m)$ and the current Y-axis reliability weight $\alpha_Y(m)$. In this case, the serial decoding unit 420 may decode the current Z-axis input value $R_Z(m)$ to generate the current Z-axis decoding value $W_Z(m)$.

In this case, as illustrated in FIG. 7, the X-axis reliability weight $\alpha_X$ and the Y-axis reliability weight $\alpha_Y$ may be set in advance for every decoding time and may refer to 0.25 in the first decoding, 0.5 in the second decoding, 0.75 in the third decoding, and 1 in the fourth decoding.

In this case, when the current Z-axis input value $R_Z(m)$ which is input to the serial decoding unit 420 in the m-th decoding is represented by Equation, the following Equation 3 may be obtained.

$$R_Z(m)=[R]+\alpha_X(m)\times W_X(m)+\alpha_Y(m)\times W_Y(m) \quad \text{[Equation 3]}$$

In this case, m refers to a iterative decoding time, $R_Z(m)$ refers to an m-th Z-axis input value, [R] refers to a received signal value, $\alpha_X(m)$ refers to a m-th X-axis reliability weight, $W_X(m)$ refers to a m-th X-axis decoding value, $\alpha_Y(m)$ refers to a m-th Y-axis reliability weight, and $W_Y(m)$ refers to a m-th Y-axis decoding value.

Now, an error correction performance of the hybrid type iterative decoding method and apparatus according to the present solution and the serial decoding scheme and the parallel decoding scheme of the related art may be compared with reference to FIG. 8.

FIG. 8 is a view for comparing an error correcting performance of a hybrid type iterative decoding method and apparatus according to the present solution and a decoding system of the related art.

As illustrated in FIG. 8, an example that a chase-pyndiah decoding algorithm is applied to decode the X-axis and the Y-axis and a normalized min-sum decoding algorithm is applied to decode the Z-axis will be described. When an error correction performance of the hybrid type iterative decoding method and apparatus according to the present solution and the serial decoding scheme and the parallel decoding scheme of the related art is compared, it is identified that when a coding gain is represented by a dB scale under the condition of a bit error rate of $10^{-6}$, a coding gain of the parallel decoding scheme is 2.9 dB, a coding gain of the serial decoding scheme is 2.6 dB, and a coding gain of the hybrid type iterative decoding method and apparatus according to the present solution is 2.7 dB.

This means that the error correcting performance of the hybrid type iterative decoding method and apparatus according to the present soluton is inferior to that of the serial decoding scheme of the related art, but is superior to that of the parallel decoding scheme of the related art.

In this case, a difference is 0.1 dB as a result of the comparison of the serial decoding scheme and the hybrid type iterative decoding method and apparatus according to the present solution and a difference is 0.2 dB as a result of the comparison of the parallel decoding scheme and the hybrid type iterative decoding method and apparatus according to the present solution. Therefore, it is identified that the hybrid type iterative decoding method and apparatus according to the present solution exhibits an error correcting performance which is almost close to the serial decoding scheme.

Now, a throughput of the hybrid type iterative decoding method and apparatus according to the present solution and the serial decoding scheme and the parallel decoding scheme of the related art may be compared with reference to FIG. 9.

FIG. 9 is a view for comparing an operation time of a hybrid type iterative decoding method and apparatus according to the present solution and a decoding system of the related art.

As illustrated in FIG. 9, the serial decoding scheme of the related art requires operation times including a current X-axis input value decision time, a current X-axis decoding time, a current Y-axis input value decision time, a current Y-axis decoding time, a current Z-axis input value decision time, and a current Z-axis decoding time.

In the meantime, in the parallel decoding scheme of the related art, the current X-axis input value decision, the current Y-axis input value decision, and the current Z-axis input value decision are simultaneously performed at the same timing, the current X-axis decoding, the current Y-axis decoding, and the current Z-axis decoding are simultaneously performed at the same timing and then the Z-axis input value decision is performed. Therefore, the operation times including the current X-axis input value decision time, the current X-axis decoding time, and the subsequent Z-axis input value decision time is required.

In contrast, in the hybrid type iterative decoding method and apparatus according to the present solution, since the current X-axis input value decision and the current Y-axis input value decision are simultaneously performed at the same timing, the current X-axis decoding and the current Y-axis decoding are simultaneously performed at the same timing, the operation times including the current X-axis input value decision time, the current X-axis decoding time, the current Z-axis input value decision time, and the current Z-axis decoding time is required.

As a result, a throughput of the parallel decoding scheme is 7.38, a throughput of the serial decoding scheme is 3.75, and a throughput of the hybrid type iterative decoding method and apparatus according to the present solution is 6.19.

Therefore, it is identified that the throughput of the hybrid type iterative decoding method and apparatus according to the present solution is almost close to the parallel decoding scheme.

That is, the hybrid type iterative decoding method and apparatus according to the present solution exhibits the error correcting performance which is almost close to the serial decoding scheme of the related art and the throughput which is almost close to the parallel decoding method of the related art.

Although the present solution has been described, it is understood that the present disclosure will be changed in various forms and those skilled in the art may carry out various variations and modifications without departing the claim of the present disclosure.

What is claimed is:

1. A hybrid type iterative decoding method for converting encoded data into decoded data, the encoded data generated using a three-dimensional turbo product code (TPC) having a first axis, a second axis, and a third axis, the hybrid type iterative decoding method being performed by at least one electronic device and comprising:
    performing parallel decoding operations to simultaneously apply
        a first predetermined decoding algorithm to a current first axis input value to generate a current first axis decoding value, and
        a second predetermined decoding algorithm to a current second axis input value to generate a current second axis decoding value,
    where the current first axis input value and the second axis input value are determined based on at least two previous decoding values, respectively, among a previous first axis decoding value, a previous second axis decoding value, and a previous third axis decoding value which are generated in advance;
    performing serial decoding operations to apply a third predetermined decoding algorithm to a current third axis input value to generate a current third axis decoding value, where the current third axis input value is determined based on the current first axis decoding value and the current second axis decoding value; and
    performing hard decision operations based on the current first axis decoding value, the current second axis decoding value, the current third axis decoding value, and a received signal value;
    wherein a value resulting from the hard decision operations represents at least a portion of the decoded data.

2. The hybrid type iterative decoding method according to claim 1, wherein the hard decision operations are performed after sequentially repeating the parallel decoding operations and the serial decoding operations by a predetermined number of iterative decoding times.

3. The hybrid type iterative decoding method according to claim 1, wherein the parallel decoding operations include:
    a first axis decoding operation in which the predetermined decoding algorithm is applied to the current first axis input value determined based on the previous second axis decoding value and the previous third axis decoding value to generate the current first axis decoding value; and
    a second axis decoding operation in which the predetermined decoding algorithm is applied to the current second axis input value determined based on the previous first axis decoding value and the previous third axis decoding value to generate the current second axis decoding value, by means of a second axis decoding unit.

4. The hybrid type iterative decoding method according to claim 3, wherein the first axis decoding operation and the second axis decoding operation are simultaneously performed in parallel with each other.

5. The hybrid type iterative decoding method according to claim 3, wherein the current first axis input value is determined further based on at least one of the received signal value and a previous second axis reliability weight indicating reliability of the previous second axis decoding value and the current second axis input value is determined further based on at least one of the received signal value and a previous first axis reliability weight indicating reliability of the previous first axis decoding value.

6. The hybrid type iterative decoding method according to claim 1, wherein the current third axis input value is determined further based on at least one of the received signal value, a current first axis reliability weight indicating reliability of the current first axis decoding value, and a current second axis reliability weight indicating reliability of the current second axis decoding value.

7. A hybrid type iterative decoding apparatus for converting encoded data into decoded data, the encoded data generated using a three-dimensional turbo product code (TPC) having a first axis, a second axis, and a third axis, the apparatus comprising:
    at least one processor configured to
        perform parallel decoding operations to
            apply a first predetermined decoding algorithm to a current first axis input value to generate a current first axis decoding value, and
            apply a second predetermined decoding algorithm to a current second axis input value to generated a current second axis decoding value,
        where the current first axis input value and the current second axis input value are determined based on at least two previous decoding values, respectively, among a previous first axis decoding value, a previous second axis decoding value, and a previous third axis decoding value which are generated in advance;
        perform serial decoding operations in which the predetermined decoding algorithm is applied to a current third axis input value to generate a current third axis decoding value, the current third axis input value determined based on the current first axis decoding value and the current second axis decoding value; and
        perform hard decision operations in which a hard decision is performed based on the current first axis decoding value, the current second axis decoding value, the current third axis decoding value, and the received signal value;
    wherein a value resulting from the hard decision operations represents at least a portion of the decoded data.

8. The hybrid type iterative decoding apparatus according to claim 7, wherein the hard decision operations are performed after sequentially repeating the parallel decoding operations and the serial decoding operations by a predetermined number of iterative decoding times.

9. The hybrid type iterative decoding apparatus according to claim 7, wherein the parallel decoding operations comprise;
    performing first axis decoding in which the predetermined decoding algorithm is applied to the current first axis input value determined based on the previous second axis decoding value and the previous third axis decoding value to generate the current first axis decoding value; and
    performing second axis decoding in which the predetermined decoding algorithm is applied to the current second axis input value determined based on the previous first axis decoding value and the previous third axis decoding value to generate the current second axis decoding value.

10. The hybrid type iterative decoding apparatus according to claim 9, wherein the first axis decoding unit and the second axis decoding are simultaneously performed in parallel with each other.

11. The hybrid type iterative decoding apparatus according to claim 9, wherein the current first axis input value is determined further based on at least one of the received signal value and a previous second axis reliability weight indicating reliability of the previous second axis decoding value and the current second axis input value is determined further based on at least one of the received signal value and a previous first axis reliability weight indicating reliability of the previous first axis decoding value.

12. The hybrid type iterative decoding apparatus according to claim 7, wherein the current third axis input value is determined further based on at least one of the received signal value, a current first axis reliability weight indicating reliability of the current first axis decoding value, and a current second axis reliability weight indicating reliability of the current second axis decoding value.

* * * * *